US012727525B2

(12) United States Patent
Wang et al.

(10) Patent No.: US 12,727,525 B2
(45) Date of Patent: Sep. 1, 2026

(54) INTEGRATED DEVICE INCLUDING DIRECT MEMORY ATTACHMENT ON THROUGH MOLD CONDUCTORS

(71) Applicant: QUALCOMM Incorporated, San Diego, CA (US)

(72) Inventors: Zhijie Wang, San Diego, CA (US); Rajneesh Kumar, San Diego, CA (US); Manuel Aldrete, Encinitas, CA (US); Sang-Jae Lee, San Diego, CA (US); Seongho Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 412 days.

(21) Appl. No.: 18/363,557

(22) Filed: Aug. 1, 2023

(65) Prior Publication Data

US 2025/0046688 A1 Feb. 6, 2025

(51) Int. Cl.

| | |
|---|---|
| ***H10W 90/00*** | (2026.01) |
| ***H10B 80/00*** | (2023.01) |
| ***H10W 70/685*** | (2026.01) |
| ***H10W 74/01*** | (2026.01) |
| ***H10W 74/10*** | (2026.01) |
| *H10W 72/00* | (2026.01) |

(52) U.S. Cl.

CPC .......... *H10W 90/701* (2026.01); *H10B 80/00* (2023.02); *H10W 70/685* (2026.01); *H10W 74/01* (2026.01); *H10W 74/141* (2026.01); *H10W 90/00* (2026.01); *H10W 72/072* (2026.01); *H10W 90/724* (2026.01)

(58) Field of Classification Search

None

See application file for complete search history.

(56) References Cited

U.S. PATENT DOCUMENTS

| | | | | |
|---|---|---|---|---|
| 2011/0156250 | A1 | 6/2011 | Goh et al. | |
| 2011/0204494 | A1 | 8/2011 | Chi et al. | |
| 2012/0211885 | A1 | 8/2012 | Choi et al. | |
| 2015/0206865 | A1* | 7/2015 | Yu | H01L 24/81 257/737 |
| 2016/0218091 | A1* | 7/2016 | Du | H01L 24/49 |
| 2017/0358557 | A1 | 12/2017 | Chen et al. | |
| 2018/0358288 | A1* | 12/2018 | Lee | H01L 23/00 |
| 2019/0189564 | A1* | 6/2019 | Guzek | H01L 23/49816 |

OTHER PUBLICATIONS

International Search Report and Written Opinion—PCT/US2024/032839—ISA/EPO—Oct. 28, 2024.

Partial International Search Report—PCT/US2024/032839—ISA/EPO—Sep. 3, 2024.

* cited by examiner

*Primary Examiner* — Nicholas J Tobergte

(74) *Attorney, Agent, or Firm* — Moore IP

(57) ABSTRACT

An integrated device includes a die including active circuitry and a first set of contacts; a first substrate including a second set of contacts and a third set of contacts on a first side of the first substrate and a fourth set of contacts on a second side of the first substrate; a mold compound disposed on the first side of the first substrate and at least partially encapsulating the die; and a set of through mold conductors coupled to the third set of contacts and extending through the mold compound, wherein an upper surface of the mold compound, an upper surface of the die, and an upper surface of each of the set of through mold conductors are coplanar.

30 Claims, 6 Drawing Sheets

108
114
104
106
102
150
128
110
118
116
126
124
122
130
120
142
100
112

126
130
128
154
152
100

INTEGRATED DEVICE INCLUDING DIRECT MEMORY ATTACHMENT ON THROUGH MOLD CONDUCTORS

FIELD

Various features relate to integrated devices including direct memory attachment on through mold conductors.

BACKGROUND

As systems become smaller and more complex, the integrated circuits forming those systems must accordingly become smaller and more efficient at handling that complexity. That efficiency includes the ability to dissipate heat at greater levels than before.

State-of-the-art mobile application devices demand a small form factor, low cost, a tight power budget, and high electrical performance. Mobile package design has evolved to meet these divergent goals for enabling mobile applications that support multimedia enhancements. These mobile application devices, however, are susceptible to size and performance issues when the underlying integrated circuits cannot adequately dissipate heat.

SUMMARY

Various features relate to integrated devices.

One example provides an integrated device that includes a die comprising active circuitry and a first set of contacts, where the first set of contacts is disposed on a first surface of the die and electrically connected to the active circuitry. The integrated device also includes a first substrate. The first substrate includes a second set of contacts and a third set of contacts on a first side of the first substrate. The first substrate also includes a fourth set of contacts on a second side of the first substrate. The first substrate also includes conductors electrically connected between various contacts of the second set of contacts, the third set of contacts, and the fourth set of contacts, wherein the second set of contacts is electrically connected to the first set of contacts of the die. The integrated device also includes a mold compound disposed on the first side of the first substrate and at least partially encapsulating the die. The integrated device also includes a set of through mold conductors coupled to the third set of contacts and extending through the mold compound, wherein an upper surface of the mold compound, an upper surface of the die, and an upper surface of each of the set of through mold conductors are coplanar.

Another example provides a device that includes an integrated device. The integrated device includes a die comprising active circuitry and a first set of contacts, where the first set of contacts is disposed on a first surface of the die and electrically connected to the active circuitry. The integrated device also includes a first substrate. The first substrate includes a second set of contacts and a third set of contacts on a first side of the first substrate. The first substrate also includes a fourth set of contacts on a second side of the first substrate. The first substrate also includes conductors electrically connected between various contacts of the second set of contacts, the third set of contacts, and the fourth set of contacts, wherein the second set of contacts is electrically connected to the first set of contacts of the die. The integrated device also includes a mold compound disposed on the first side of the first substrate and at least partially encapsulating the die. The integrated device also includes a set Of through mold conductors coupled to the third set of contacts and extending through the mold compound, wherein an upper surface of the mold compound, an upper surface of the die, and an upper surface of each of the set of through mold conductors are coplanar. The device also includes a package coupled to the set of through mold conductors. The package includes a second substrate 2ncludeng a fifth set of contacts to electrically connect a first side of the second substrate to a second side of the second substrate.

Another example provides a method for fabricating an integrated device. The method includes coupling a first substrate to a die. The die includes active circuitry and a first set of contacts, where the first set of contacts is disposed on a first surface of the die and electrically connected to the active circuitry. The first substrate includes a second set of contacts and a third set of contacts on a first side of the first substrate. The first substrate also includes a fourth set of contacts on a second side of the first substrate. The first substrate also includes conductors electrically connected between various contacts of the second set of contacts, the third set of contacts, and the fourth set of contacts, wherein coupling the first substrate to the die comprises electrically coupling the second set of contacts to the first set of contacts of the die. The method also includes disposing a mold compound on the first side of the first substrate, the mold compound at least partially encapsulating the die and a set of through mold conductors, the set of through mold conductors coupled to the third set of contacts and extending through the mold compound. The method also includes removing a portion of a surface of the set of through mold conductors to expose a connectivity pad portion of each of the set of through mold conductors.

Another example provides a method of fabricating a device including coupling a package to a set of through mold conductors of an integrated device comprising a die, a first substrate, a mold compound disposed on a first side of the first substrate and at least partially encapsulating the die, and a set of through mold conductors. The die includes active circuitry and a first set of contacts, where the first set of contacts is disposed on a first surface of the die and electrically connected to the active circuitry. The first substrate includes a second set of contacts and a third set of contacts on the first side of the first substrate; a fourth set of contacts on a second side of the first substrate; and conductors electrically connected between various contacts of the second set of contacts, the third set of contacts, and the fourth set of contacts, second set of contacts electrically coupled to the first set of contacts of the die. The set of through mold conductors are coupled to the third set of contacts and extend through the mold compound. An upper surface of the mold compound, an upper surface of the die, and an upper surface of each of the set of through mold conductors are coplanar. The package comprises a second substrate including a fifth set of contacts to electrically connect a first side of the second substrate to a second side of the second substrate.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

Figures 1A, 1B:
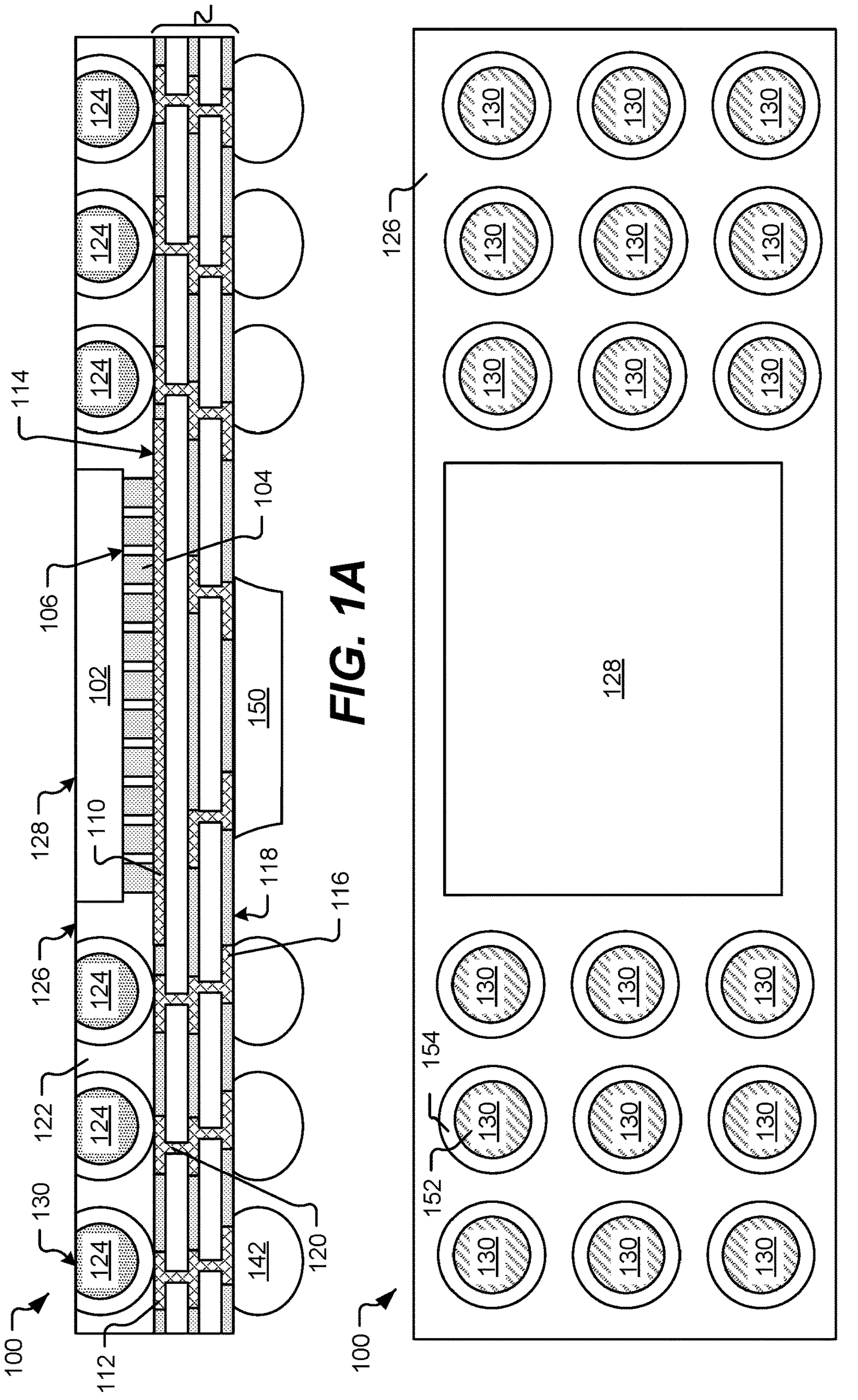
FIG. 1A illustrates a cross sectional profile view of an integrated device.
FIG. 1B illustrates a top view of the exemplary integrated device of FIG. 1A.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Particular aspects of the present disclosure are described below with reference to the drawings. In the description, common features are designated by common reference numbers. As used herein, various terminology is used for the purpose of describing particular implementations only and is not intended to be limiting of implementations. For example, the singular forms "a," "an," and "the" are intended to include the plural forms as well, unless the context clearly indicates otherwise. Further, some features described herein are singular in some implementations and plural in other implementations. For ease of reference herein, such features are generally introduced as "one or more" features and are subsequently referred to in the singular or optional plural (as indicated by "(s)") unless aspects related to multiple of the features are being described.

As used herein, the terms "comprise," "comprises," and "comprising" may be used interchangeably with "include," "includes," or "including." As used herein, "exemplary" indicates an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to one or more of a particular element, and the term "plurality" refers to multiple (e.g., two or more) of a particular element.

Improvements in manufacturing technology and demand for lower cost and more capable electronic devices has led to increasing complexity of integrated devices. This increasing complexity includes resolving the conflict between the smaller size of an integrated device and its ability to handle increasingly complex operations. Along with increasingly complex operations comes requirements for the integrated device to dissipate greater amounts of heat.

Certain approaches to integrated device design include side-by-side packages that can take up a relatively large footprint on a printed circuit board. Other approaches apply a package-on-package design generally using an interposer substrate between the packages. Both approaches can run into constraints on a lower limit of a form factor incorporating such devices. For example, a Molded Embedded Package ("MEP") uses an interposer substrate between an integrated device including active circuitry and conductive pads used to electrically couple a memory package to the integrated device. The interposer substrate used in this approach can increases the size of the package and can limit thermal conductivity.

State-of-the-art mobile application devices demand a small form factor, low cost, a tight power budget, and high electrical performance. Removing the interposer substrate from a package-on-package design approach allows for a reduced form factor and greater heat dissipation. The approach described in the subject disclosure can also allow for better performance of the overall device. For example, when a memory package is coupled to the integrated device described herein, the resultant device can have a shorter connection between the device and the memory package, resulting in improved memory performance.

Exemplary Integrated Device Including Direct Memory Attachment on Through Mold Conductors FIG. 1A illustrates a cross sectional profile view of an integrated device 100. FIG. 1B illustrates a top view of the exemplary integrated device 100 of FIG. 1A.

The integrated device 100 includes a die 102, a first substrate 108, a mold compound 122 disposed on a first side 114 of the first substrate 108 and at least partially encapsulating the die 102, and a set of through mold conductors 124 extending through the mold compound 122, wherein an upper surface 126 of the mold compound 122, an upper surface 128 of the die 102, and an upper surface 130 of each of the set of through mold conductors 124 are coplanar.

The die 102 includes active circuitry, such as a plurality of transistors and/or other circuit elements arranged and interconnected to form logic cells, memory cells, etc. Components of the integrated circuitry can be formed in and/or over a semiconductor substrate. Different implementations can use different types of transistors, such as a field effect transistor (FET), planar FET, finFET, a gate all around FET, or mixtures of transistor types. In some implementations, a front end of line (FEOL) process may be used to fabricate the integrated circuitry in and/or over the semiconductor substrate. In the integrated device 100 of FIGS. 1A and 1B, the die 102 includes active circuitry and a first set of contacts including representative first contact 104, disposed on a first surface 106 of the die 102 and electrically connected to the active circuitry.

For the purposes of the subject disclosure, representative numbers can be used to indicate one or more like components of FIGS. 1A and 1B. For example, the first set of contacts includes representative first contact 104. To aid in understanding, "104" can be used to refer to representative first contact, one or more of the first set of contacts, or some combination thereof. Reference numbers are used in a similar manner for other sets of contacts and conductors throughout the subject disclosure.

The first substrate 108 includes a second set of contacts 110, and a third set of contacts 112 on a first side 114 of the first substrate 108. The first substrate 108 also includes a fourth set of contacts 116 on a second side 118 of the first substrate 108. The first substrate 108 also includes conductors 120 electrically connected between various contacts of the second set of contacts 110, the third set of contacts 112, and the fourth set of contacts 116. The second set of contacts 110 is electrically connected to the first set of contacts 104 of the die 102. In some aspects, one or more of the conductors 120 can include through-silicon vias to electrically connect various contacts of the second set of contacts 110, the third set of contacts 112, and the fourth set of contacts 116.

The integrated device 100 of FIGS. 1A and 1B also includes the mold compound 122 disposed on the first substrate 108 and at least partially encapsulating the die 102. The integrated device also includes the set of through mold conductors 124 coupled to the third set of contacts 112 and extending through the mold compound 122. The upper surface 126 of the mold compound 122, the upper surface 128 of the die 102, and the upper surface 130 of each of the set of through mold conductors 124 are coplanar. In some aspects, one or more of the set of through mold conductors 124 includes a ball with a copper core at least partially covered with another conductive material. In a particular aspect, the conductive material that at least partially covers the copper core includes a solder alloy. In the same or alternative aspects, one or more of the set of through mold conductors 124 includes a ball formed from a solder alloy, a copper post, or some combination thereof. In a particular aspect, the upper surface 130 of one or more of the set of through mold conductors 124 includes a copper portion 152 ringed by a solder portion 154, as best seen in FIG. 1B.

In some implementations, the die 102 can also include a power distribution network ("PDN"). The PDN can include, for example, one or more power rails, one or more ground rails, etc. In some aspects, the integrated device 100 can also include a landside capacitor 150 disposed on the second side 118 of the first substrate 108 and coupled to the PDN of the die 102. In a particular aspect, the capacitor 150 can be configured to aid in noise suppression for the PDN.

In the same or alternative implementations, the integrated device 100 can also include a ball grid array ("BGA") 142. The BGA can include or be directly connected to the fourth set of contacts 116. The BGA can include a plurality of conductive pins formed from, for example, a solder alloy.

As describe below with reference to FIG. 2, additional packages can be directly coupled to the integrated device 100 of FIGS. 1A and 1B. For example, a memory package can be coupled to the upper surface 130 of the set of through mold conductors 124. In some implementations, the set of through mold conductors 124, along with the mold compound 122 and the die 102 can provide sufficient structural support for a device including the integrated device 100 and another package without the use of an interposer substrate, reducing the overall size of the device. Additionally, by having the upper surface 128 of the die 102 exposed (e.g., to the air), the integrated device 100 is able to dissipate more heat than, for example, having the die 102 partially (or completely) covered by the mold compound 122 or having the interposer substrate cover some or all of the die 102. Applying this approach can allow a reduction in package thickness, as compared to conventional MEP structures, of approximately 25% and improve heat dissipation.

Exemplary Device Including Direct Memory Attachment on Through Mold Conductors

Figure 2:
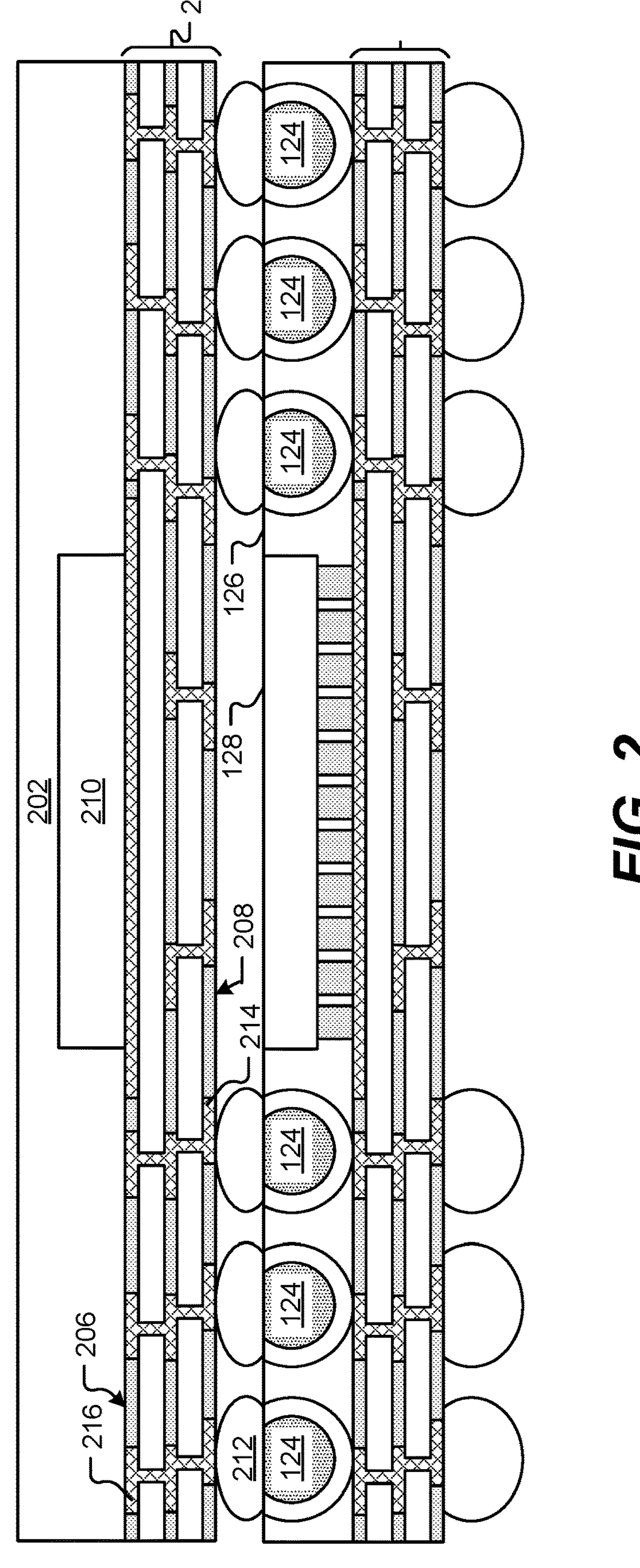
FIG. 2 illustrates a cross-sectional profile view of a device that includes the integrated device of FIG. 1 coupled to a memory package.

FIG. 2 illustrates a cross sectional profile view of a device 200 that includes the integrated device 100 of FIG. 1 coupled to a memory package 202. The device 200 of FIG. 2 includes many of the same components and features as are described above with reference to FIGS. 1A and 1B. Such components and features are physically and operationally the same as described above with reference to FIGS. 1A and 1B and are labeled in FIG. 2 using the same reference numbers. In some implementations, the device 200 includes all of the same features and components as the device 100 of FIGS. 1A and 1B; however, some components and features illustrated in FIGS. 1A and 1B have been omitted from (or are not labeled with reference numbers in) FIG. 2 for simplicity of illustration and to highlight differences between the device 100 and the device 200. Omission of such features and reference numbers should not be understood as limiting the features and components of FIG. 2 to only those specifically called out below. For example, while FIG. 2 does not show the optional capacitor 150 of FIG. 1A, the device 200 can include the optional capacitor 150.

The device 200 includes a memory package 202 coupled to the set of through mold conductors 124. The memory package 202 includes a second substrate 204. The second substrate 204 includes a fifth set of contacts 214 to electrically connect a first side 206 of the second substrate 204 to a second side 208 of the second substrate 204.

In some aspects, the second side 208 of the second substrate 204 is coupled to the set of through mold conductors 124 such that the upper surface 130 of a through mold conductor 124 directly contacts an interconnect solder ball 212. In such aspects, the interconnect solder ball 212 directly contacts a contact of the fifth set of contacts 214.

In the same or alternative aspects, no redistribution layer is disposed between the upper surface 130 of each of the set of through mold conductors 124 and the second side 208 of the second substrate 204. As described in more detail above with reference to FIGS. 1A and 1B, removing a redistribution layer such as an interposer substrate can allow the device 200 to have a reduced form factor, increased heat dissipation, increased performance, or some combination thereof.

In FIG. 2, the memory package 202 includes memory circuitry 210 (e.g., memory cells). In a particular aspect, the memory circuitry includes dynamic random access memory ("DRAM") circuitry. The memory package 202 also includes a sixth set of contacts 216 disposed on the first side 206 of the second substrate 204 and electrically connected to the memory circuitry 210.

In some implementations, the device 200 can be integrated in a smartphone, a tablet computer, a fixed location terminal device, an automobile, a wearable electronic device, a laptop computer, or some combination thereof, as described in more detail below with reference to FIG. 5.

While FIG. 2 illustrates an example device that includes one package coupled to an integrated device, in other examples, one or more additional integrated devices, packages, or some combination thereof can be present in a stacked integrated circuit without departing from the scope of the subject disclosure. Further, while FIG. 2 illustrates an integrated device in the context of a memory package, the integrated device disclosed herein can be integrated with or included within a wide variety of other devices. For example, a device that includes one or more of the integrated devices disclosed herein can include components such as a power management integrated circuit (PMIC), an application processor, a modem, a radio frequency (RF) device, a passive device, a filter, a capacitor, an inductor, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. In such devices, the integrated device can operate as any of these components (or a combination of these components) that includes active circuitry.

Figure 3A:
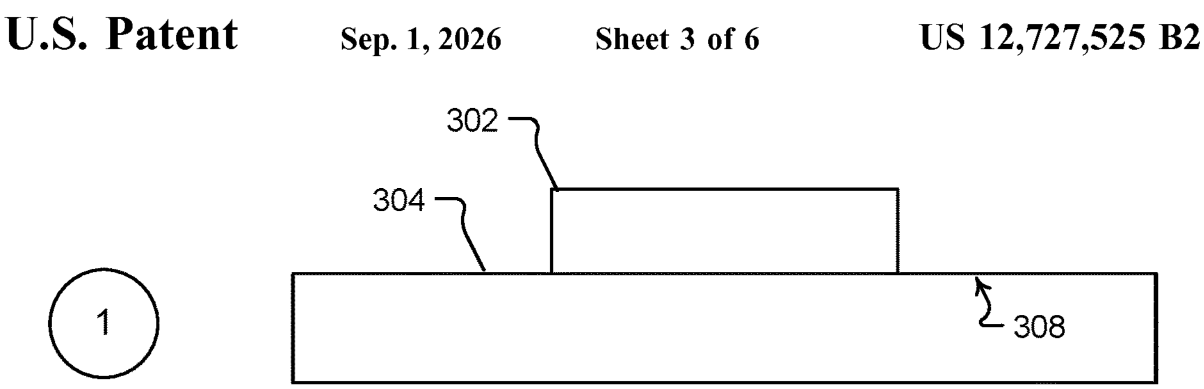
FIG. 3A illustrates a first part of an exemplary sequence for providing or fabricating an exemplary device.
Figure 3A:
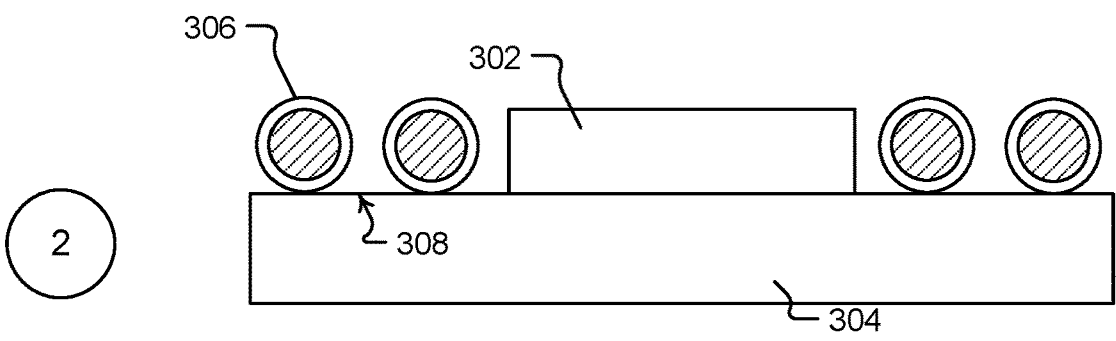
Figure 3A:
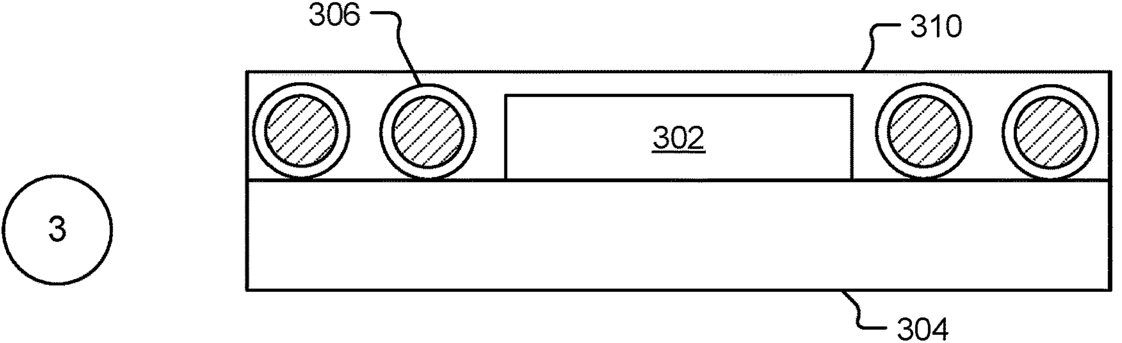
Figure 3B:
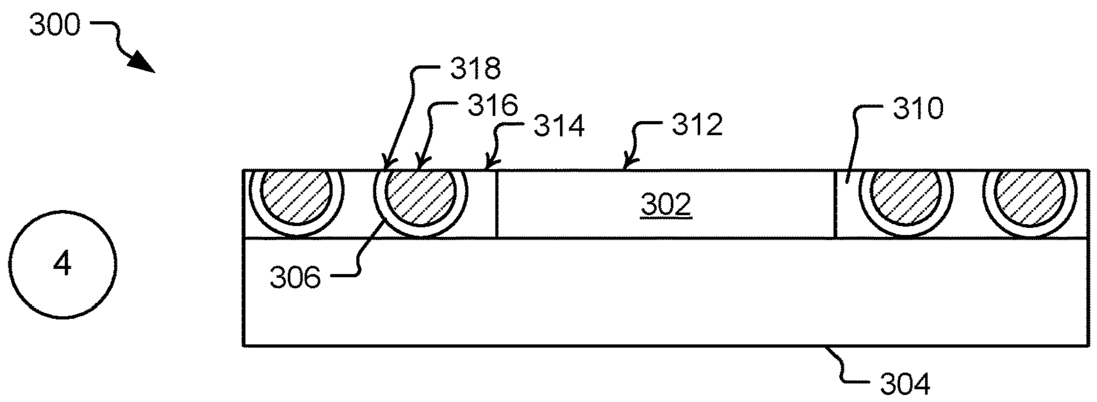
FIG. 3B illustrates a second part of an exemplary sequence for providing or fabricating an exemplary device.
Figure 3B:
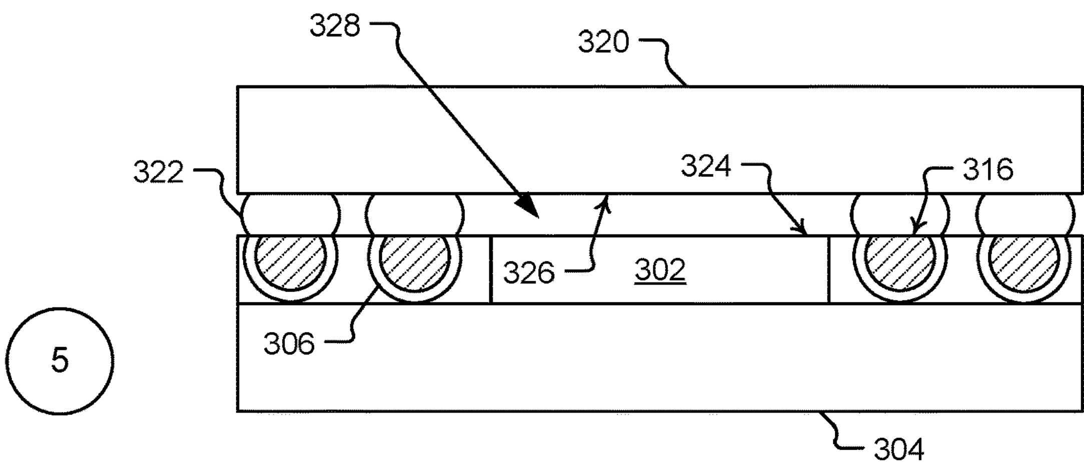
Figure 3B:
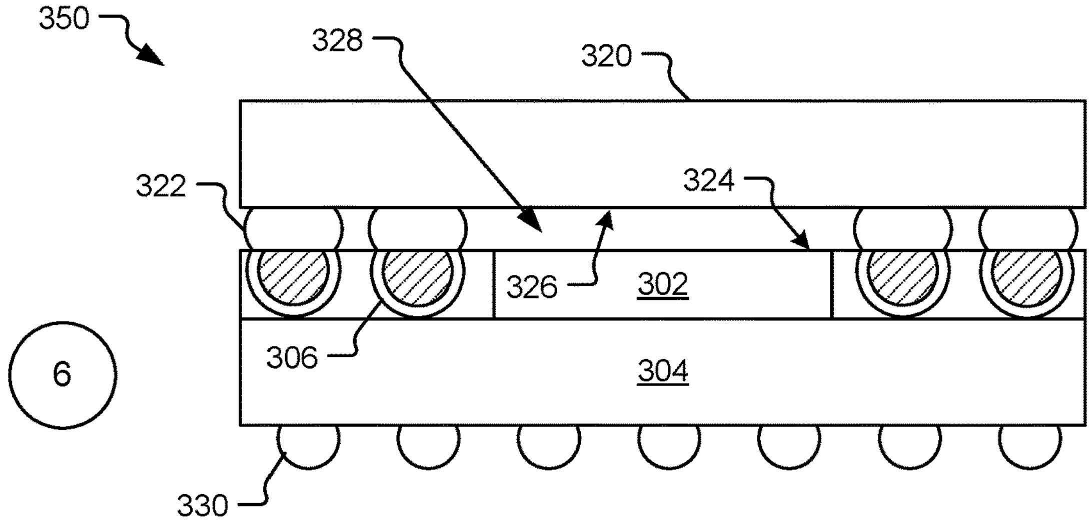

Exemplary Sequence for Fabricating a Stacked IC Device Including Integrated Capacitor Device In some implementations, fabricating an integrated device 300 (e.g., the integrated device 100 of FIGS. 1A and 1B) includes several processes. FIGS. 3A and 3B illustrate an exemplary sequence for providing or fabricating an integrated device, as described with reference to any of FIGS. 1A-2. In some implementations, the sequence of FIGS. 3A and 3B may be used to provide (e.g., during fabrication of) one or more of the integrated devices 100 of FIGS. 1A and 1B.

It should be noted that the sequence of FIGS. 3A and 3B may combine one or more stages in order to simplify and/or clarify the sequence for providing or fabricating an integrated device. In some implementations, the order of the processes may be changed or modified. In some implementations, one or more of the processes may be replaced or substituted without departing from the scope of the disclosure. In the following description, reference is made to various illustrative Stages of the sequence, which are numbered (using circled numbers) in FIGS. 3A and 3B. Each of the various stages of the sequence illustrated in FIGS. 3A and 3B shows a single integrated device being formed. In other implementations, a plurality of integrated devices can be formed concurrently.

Stage 1 of FIG. 3A illustrates a state after a die 302 (e.g., the die 102 of FIG. 1A) and a substrate 304 (e.g., the first substrate 108 of FIG. 1A) have been coupled to one another. For example, as part of Stage 1, the first set of contacts 104 of FIG. 1A can be electrically coupled to the second set of contacts 110.

In some implementations, the die 302 includes active circuitry and a first set of contacts. The first set of contacts is disposed on a first surface of the die and electrically connected to the active circuitry. The substrate 304 includes a second set of contacts and a third set of contacts on a surface 308 (e.g., the first side 114 of the first substrate 108 of FIG. 1A) of the substrate 304. The substrate 304 also includes a fourth set of contacts on a second side of the substrate 304. The substrate 304 also includes conductors electrically connected between various contacts of the second set of contacts, the third set of contacts, and the fourth set of contacts. In a particular aspect, coupling the substrate 304 to the die 302 includes electrically coupling the second set of contacts to the first set of contacts of the die 302.

Stage 2 illustrates a state after a set of through mold conductors 306 (e.g., the set of through mold conductors 124 of FIG. 1A) have been coupled to contacts (e.g., the third set of contacts 112 of FIG. 1A) on the surface 308 of the substrate 304. In a particular example, one or more of the through mold conductors 306 can include a ball with a copper core at least partially covered with another conductive material (e.g., a solder alloy), a ball formed from a solder alloy, a copper post, or some combination thereof.

In some aspects, one or more of the through mold conductors 306 include a ball with a copper core at least partially covered with a solder alloy. In a particular aspect, after such through mold conductors 306 have been placed and prior to Stage 3, formation of the integrated device 300 can also include reflowing the solder alloy to electrically connect the through mold conductors 306 to the third set of contacts of the substrate 304.

Stage 3 illustrates a state after a mold compound 310 (e.g., the mold compound 122 of FIG. 1A) has been disposed on the surface 308 of the substrate 304. The mold compound 310 at least partially encapsulates the die 302 and the set of through mold conductors 306. In FIG. 3A, the mold compound 310 covers all of the die 302 and the set of through mold conductors 306. The mold compound 310 can be disposed to cover a portion of the die 302, a portion of one or more of the set of through mold conductors 306, or some combination thereof without departing from the scope of the subject disclosure.

Stage 4 of FIG. 3B illustrates a state after a portion of the mold compound 310 has been removed, making a surface 312 of the die 302 (e.g., the upper surface 128 of FIG. 1A), a surface 314 of the mold compound 310 (e.g., the upper surface 126 of FIG. 1A), and surface 318 of the set of through mold conductors 306 (e.g., the upper surface 130 of FIG. 1A) coplanar and exposing a connectivity pad portion 316 of each of the set of through mold conductors 306. In a particular aspect, the pad portion 316 includes a copper portion ringed by a solder portion.

In some implementations, removing the portion of the mold compound 310 can be accomplished by grinding, polishing, etching, other appropriate mold compound 310 removal methods, or some combination thereof. In a particular aspect, stage 4 marks a complete integrated device 300 (e.g., the integrated device 100 of FIG. 1A).

As described in more detail above with reference to FIGS. 1A-2, the integrated device 300 can, in some implementations, be coupled to one or more additional packages (e.g., memory package(s)) to form a device. Stages 5-6 of FIG. 3B, described below, illustrate an exemplary method for fabricating such a device 350. Stages 5-6 are optional and are not intended to limit the scope of the subject disclosure. Additionally, Stages 5-6 can be performed later in time than stages 1-4. For example, the integrated device 300 can be fabricated initially, and the device 350 fabricated as part of a subsequent, separate fabrication process. Further, Stage 5 can be followed by Stage 6 and vice versa.

Stage 5 of FIG. 3B illustrates a state after a second device 320 is coupled to the integrated device 300. In some implementations, coupling the second device 320 to the pad portions 316 includes placing a solder ball 322 on each of the pad portions 316. The device 320 can then be placed atop the solder balls 322 such that a surface 326 of the second device 320 contacts the solder balls 322. Coupling the second device 320 to the pad portions 316 can create an air gap 328 between a surface 324 and the surface 326 of the integrated device 300. As described in more detail above with reference to FIGS. 1A-2, having a surface of the die 302 exposed to the air gap 328 can increase the heat dissipation of the integrated device 300.

Stage 6 of FIG. 3B illustrates a state after a plurality of solder balls 330 have been coupled to the substrate 304 to form a ball grid array. In a particular aspect, Stage 6 marks the complete device 350.

As noted above, in some implementations, Stages 5 and 6 may occur in any order. In a particular aspect, for example, the solder balls 330 can be coupled to the substrate 304 to form the BGA prior to coupling the second device 320 to the integrated device 300. In such an aspect, additional steps can be included. For example, a passivation layer can be applied to the surface 324 of the integrated device 300 prior to coupling the solder balls 330. After coupling the solder balls 330, the passivation layer can be removed prior to commencing Stage 5. In an instance where stage 6 precedes Stage 5, Stage 5 marks the complete device 350.

Although certain Stages are illustrated in FIGS. 3A and 3B in forming the integrated device 300 and/or the device 350, other processes can be included in the fabrication of the integrated device 300 and/or the device 350 without departing from the scope of the subject disclosure. For example, fabricating the integrated device 300 can include applying a thermal conductive layer to an upper surface of the die 302. This can include applying the thermal conductive layer prior to or after coupling the second device 320 (e.g., the memory package 202 of FIG. 2) to the pad portions 316 of the set of through mold conductors 306.

Exemplary Flow Diagram of a Method for Fabricating an Integrated Device

Figure 4:
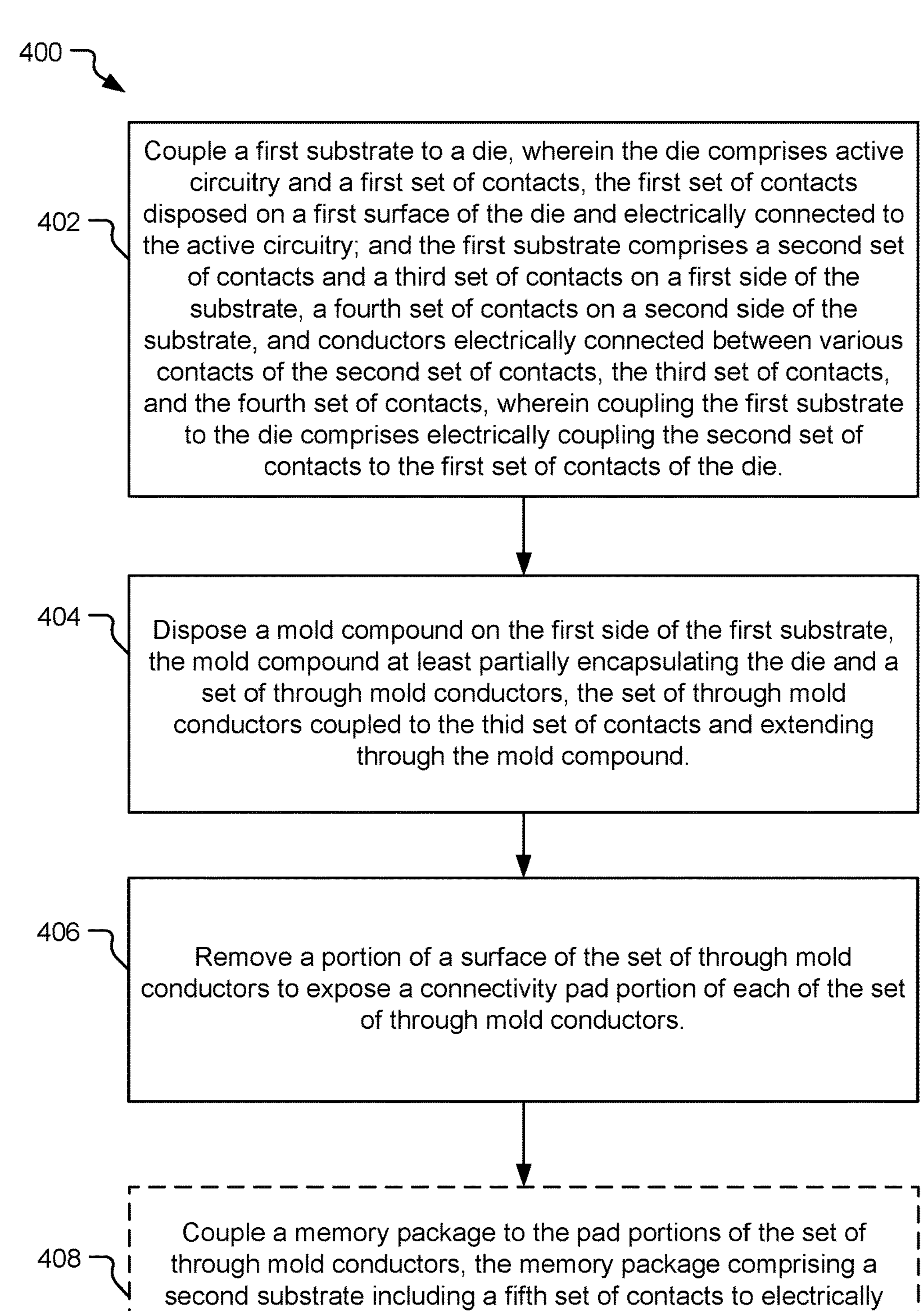
FIG. 4 illustrates an exemplary flow diagram of a method for providing or fabricating an integrated device.

In some implementations, fabricating an integrated device includes several processes. FIG. 4 illustrates an exemplary flow diagram of a method 400 for providing or fabricating an integrated device. In some implementations, the method 400 of FIG. 4 may be used to provide or fabricate any of the integrated devices 100, 300 of FIGS. 1A-3B.

It should be noted that the method 400 of FIG. 4 may combine one or more processes in order to simplify and/or clarify the method for providing or fabricating an integrated device. In some implementations, the order of the processes may be changed or modified.

The method 400 includes, at block 402, coupling a first substrate to a die. The die includes active circuitry and a first set of contacts, where the first set of contacts is disposed on a first surface of the die and electrically connected to the active circuitry. The first substrate includes a second set of contacts and a third set of contacts on a first side of the substrate. The first substrate also includes a fourth set of contacts on a second side of the substrate. The first substrate also includes conductors electrically connected between various contacts of the second set of contacts, the third set of contacts, and the fourth set of contacts, wherein coupling the first substrate to the die comprises electrically coupling the second set of contacts to the first set of contacts of the die. For example, Stage 1 of FIG. 3A illustrates and describes examples of coupling the substrate 304 to the die 302. The first substrate of the method 400 can include the first substrate 108 of FIGS. 1A-2, the substrate 304 of FIG. 3A, or some combination thereof. The die of the method 400 can include the die 102 of FIGS. 1A-2, the die 302 of FIG. 3A, or some combination thereof. The various components of the die and the first substrate of the method 400 can include the correspondingly named components of FIGS. 1A-3B.

The method 400 includes, at block 404, disposing a mold compound on the first side of the first substrate, the mold compound at least partially encapsulating the die and a set of through mold conductors, the set of through mold conductors coupled to the third set of contacts and extending through the mold compound. For example, Stage 3 of FIG. 3A illustrates and describes examples of disposing the mold compound 310 on the substrate 304, the mold compound 310 at least partially encapsulating the die 302 and a set of through mold conductors 306. The mold compound of the method 400 can include the mold compound 122 of FIGS. 1A-2, the mold compound 310 of FIG. 3A, or some combination thereof. The through mold conductors of the method 400 can include the set of through mold conductors 124 of FIGS. 1A-2, the set of through mold conductors 306 of FIG. 3A, or some combination thereof.

The method 400 includes, at block 406, removing a portion of a surface of the set of through mold conductors to expose a connectivity pad portion of each of the set of through mold conductors. For example, Stage 4 of FIG. 3B illustrates and describes examples of removing a portion of a surface of the set of through mold conductors 306 to expose a connectivity pad portion 316 of each of the set of through mold conductors 306. The connectivity pad portion of the method 400 can include the upper surface 130 of FIGS. 1A-2, the pad portion 316 of FIG. 3B, or some combination thereof.

The method 400 optionally includes, at block 408, coupling a memory package to the pad portions of the set of through mold conductors, the memory package comprising a second substrate including a fifth set of contacts to electrically connect a first side of the second substrate to a second side of the second substrate. For example, Stage 5 of FIG. 3B illustrates and describes examples of coupling the second device 320 to the pad portions 316 of the set of through mold conductors 306. The memory package of the method 400 can include the memory package 202 of FIG. 2, the second device 320 of FIG. 3B, or some combination thereof.

In some aspects, coupling the memory package includes coupling the memory package to the pad portions of the set of through mold conductors such that the pad portions of the set of through mold conductors are electrically coupled to the fifth set of contacts of the second substrate of the memory package. In the same or alternative aspects, the memory package also includes memory circuitry and a sixth set of contacts disposed on the first side of the second substrate and electrically connected to the memory circuitry. In a particular such aspect, the memory circuitry comprises dynamic random access memory ("DRAM") circuitry.

In some aspects, after coupling the memory package to the pad portions of the set of through mold conductors, the method 400 can also optionally include applying a thermal conductive layer to a portion of an upper surface of the die. In a particular aspect, applying the thermal conductive layer includes applying the thermal conductive layer prior to coupling the memory package to the pad portions of the set of through mold conductors. In another aspect, applying the thermal conductive layer includes applying the thermal conductive layer after coupling the memory package to the pad portions of the set of through mold conductors.

In some implementations, the method 400 can include other optional processes. In some aspects, the method 400 can optionally include removing a portion of the mold compound such that an upper surface of the mold compound is coplanar with the pad portions of the set of through mold conductors. For example, Stage 4 of FIG. 3B illustrates and describes an aspect in which an upper surface of the mold compound 310 is coplanar with the pad portions 316 of the set of through mold conductors 306.

In the same or alternative aspects, the method 400 can optionally include removing a portion of the die such that an upper surface of the die is coplanar with the pad portions of the set of through mold conductors. For example, Stage 4 of FIG. 3B illustrates and describes an aspect in which an upper surface of the die 302 is coplanar with the pad portions 316 of the set of through mold conductors 306.

In further the same or alternative aspects, the method 400 can optionally include coupling a set of solder balls to the fourth set of contacts of the first substrate to form a ball grid array. For example, Stage 6 of FIG. 3B illustrates and describes an aspect in which a set of solder balls 330 are coupled to the substrate 304.

Still further, at least one of the set of through mold conductors of the method 400 can include a ball with a copper core at least partially covered with another conductive material. In some aspects, the conductive material can include a solder alloy. In a particular aspect, the method 400 can optionally include, prior to disposing the mold compound on the first side of the first substrate, placing the set of through mold conductors and reflowing the solder alloy to electrically connect the set of through mold conductors to the third set of contacts.

Exemplary Electronic Devices

Figure 5:
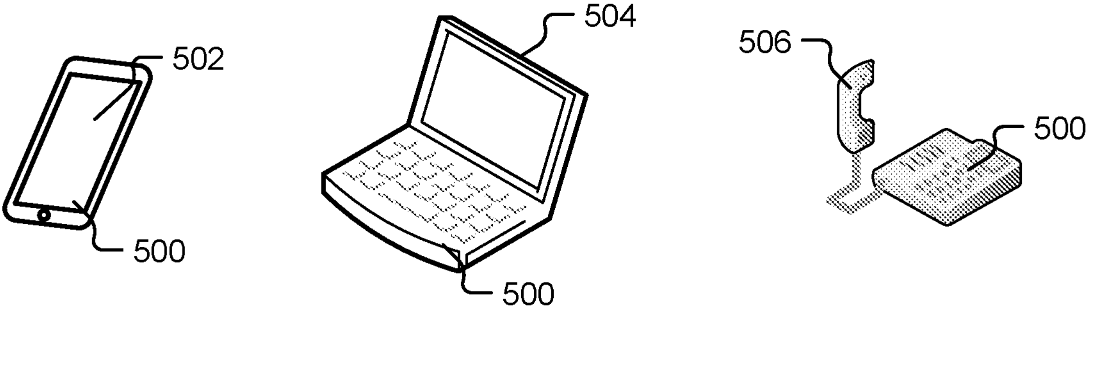
FIG. 5 illustrates various electronic devices that may include a die, an electronic circuit, an integrated device, an integrated passive device (IPD), a passive component, a package, and/or a device package described herein.
Figure 5:
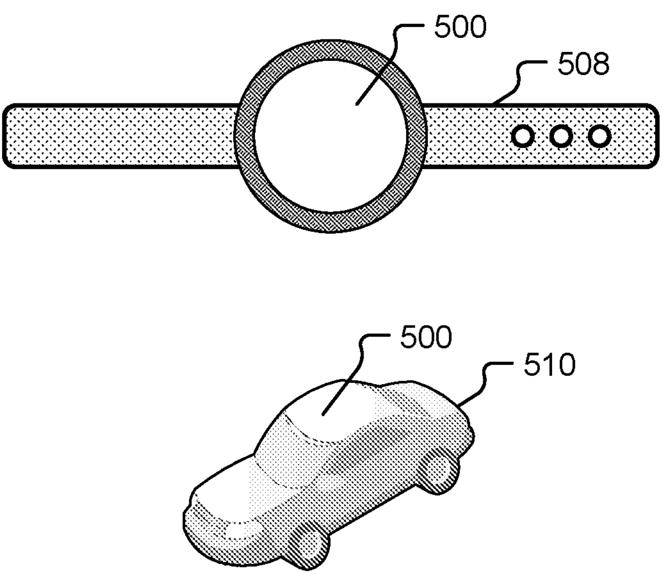

FIG. 5 illustrates various electronic devices that may include or be integrated with any of the integrated devices 100, 300 of FIGS. 1A-4 and/or devices 200, 350 of FIGS. 2-4. For example, a mobile phone device 502, a laptop computer device 504, a fixed location terminal device 506, a wearable device 508, or a vehicle 510 (e.g., an automobile or an aerial device) may include a device 500. The device 500 can include, for example, any of the integrated devices 100, 300 of FIGS. 1A-4 and/or any of the devices 200, 350 of FIGS. 2-4 described herein. The devices 502, 504, 506 and 508 and the vehicle 510 illustrated in FIG. 5 are merely exemplary. Other electronic devices may also feature the device 500 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in vehicles (e.g., autonomous vehicles), or any other device that stores or retrieves data or computer instructions, or any combination thereof.

One or more of the components, processes, features, and/or functions illustrated in FIGS. 1A-5 may be rearranged and/or combined into a single component, process, feature or function or embodied in several components, processes, or functions. Additional elements, components, processes, and/or functions may also be added without departing from the disclosure. It should also be noted FIGS. 1A-5 and its corresponding description in the present disclosure is not limited to dies and/or integrated circuits. In some implementations, FIGS. 1A-5 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. An object A, that is coupled to an object B, may be coupled to at least part of object B. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to as a second component, may be the first component, the second component, the third component or the fourth component. The terms "encapsulate", "encapsulating" and/or any derivation means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The term "about 'value X'", or "approximately value X", as used in the disclosure means within 10 percent of the 'value X'. For example, a value of about 1 or approximately 1, would mean a value in a range of 0.9-1.1. A "plurality" of components may include all the possible components or only some of the components from all of the possible components. For example, if a device includes ten components, the use of the term "the plurality of components" may refer to all ten components or only some of the components from the ten components.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

According to Example 1, an integrated device includes a die comprising active circuitry and a first set of contacts, the first set of contacts disposed on a first surface of the die and electrically connected to the active circuitry. The integrated device also includes a first substrate. The first substrate includes a second set of contacts and a third set of contacts on a first side of the first substrate; a fourth set of contacts on a second side of the first substrate; and conductors electrically connected between various contacts of the second set of contacts, the third set of contacts, and the fourth set of contacts, wherein the second set of contacts is electrically connected to the first set of contacts of the die. The integrated device also includes a mold compound disposed on the first side of the first substrate and at least partially encapsulating the die. The integrated device also includes a set of through mold conductors coupled to the third set of contacts and extending through the mold compound, wherein an upper surface of the mold compound, an upper surface of the die, and an upper surface of each of the set of through mold conductors are coplanar.

Example 2 includes the integrated device of Example 1, further comprising a ball grid array, wherein the BGA includes or is directly connected to the fourth set of contacts.

Example 3 includes the integrated device of Example 1 or Example 2, wherein at least one of the through mold conductors comprises a ball with a copper core at least partially covered with another conductive material.

Example 4 includes the integrated device of Example 3, wherein the conductive material comprises a solder alloy.

Example 5 includes the integrated device of any of Examples 1 to 4, wherein at least one of the through mold conductors comprises a ball formed from a solder alloy.

Example 6 includes the integrated device of any of Examples 1 to 5, wherein at least one of the through mold conductors comprises a copper post.

Example 7 includes the integrated device of any of Examples 1 to 6 and further includes a memory package coupled to the set of through mold conductors, the memory package comprising a second substrate including a fifth set of contacts to electrically connect a first side of the second substrate to a second side of the second substrate.

Example 8 includes the integrated device of Example 7, wherein the second side of the second substrate is coupled to the set of through mold conductors such that the upper surface of a through mold conductor of the set of through mold conductors directly contacts an interconnect solder ball, and the interconnect solder ball directly contacts a contact of the fifth set of contacts.

Example 9 includes the integrated device of Example 7 or Example 8, wherein no redistribution layer is disposed between the upper surface of each of the set of through mold conductors and the second side of the second substrate.

Example 10 includes the integrated device of any of Examples 7 to 9, wherein the memory package further comprises memory circuitry and a sixth set of contacts disposed on the first side of the second substrate and electrically connected to the memory circuitry.

Example 11 includes the integrated device of Example 10, wherein the memory circuitry comprises dynamic random access memory circuitry.

Example 12 includes the integrated device of any of Examples 1 to 11, wherein the upper surface of a through mold conductor of the set of through mold conductors comprises a copper portion ringed by a solder portion.

According to Example 13, a device includes an integrated device includes a die including active circuitry and a first set of contacts, the first set of contacts disposed on a first surface of the die and electrically connected to the active circuitry. The integrated device also includes a first substrate. The first substrate includes a second set of contacts and a third set of contacts on a first side of the first substrate; a fourth set of contacts on a second side of the first substrate; and conductors electrically connected between various contacts of the second set of contacts, the third set of contacts, and the fourth set of contacts, wherein the second set of contacts is electrically connected to the first set of contacts of the die. The integrated device also includes a mold compound disposed on the first side of the first substrate and at least partially encapsulating the die. The integrated device also includes a set of through mold conductors coupled to the third set of contacts and extending through the mold compound, wherein an upper surface of the mold compound, an upper surface of the die, and an upper surface of each of the set of through mold conductors are coplanar. The device also includes a package coupled to the set of through mold conductors, the package including a second substrate including a fifth set of contacts to electrically connect a first side of the second substrate to a second side of the second substrate.

Example 14 includes the device of Example 13, wherein the second side of the second substrate is coupled to the set of through mold conductors such that the upper surface of a through mold conductor of the set of through mold conductors directly contacts an interconnect solder ball, and the interconnect solder ball directly contacts a contact of the fifth set of contacts.

Example 15 includes the device of Example 13 or Example 14, wherein no redistribution layer is disposed between the upper surface of each of the set of through mold conductors and the second side of the second substrate.

Example 16 includes the device of any of Examples 13 to 15, wherein the memory package further comprises memory circuitry and a sixth set of contacts disposed on the first side of the second substrate and electrically connected to the memory circuitry.

Example 17 includes the device of Example 16, wherein the memory circuitry comprises dynamic random access memory circuitry.

Example 18 includes the device of any of Examples 13 to 17, wherein the device is integrated in a smartphone, a tablet computer, a fixed location terminal device, an automobile, a wearable electronic device, a laptop computer, or some combination thereof.

Example 19 includes the device of any of Examples 13 to 18, wherein at least one of the through mold conductors comprises a ball with a copper core at least partially covered with another conductive material.

Example 20 includes the device of Example 19, wherein the conductive material comprises a solder alloy.

Example 21 includes the device of any of Examples 13 to 20, wherein at least one of the through mold conductors comprises a ball formed from a solder alloy.

Example 22 includes the device of any of Examples 13 to 21, wherein at least one of the through mold conductors comprises a copper post.

Example 23 includes the device of any of Examples 13 to 22, wherein the upper surface of a through mold conductor of the set of through mold conductors comprises a copper portion ringed by a solder portion.

According to Example 24, a method of fabricating an integrated device includes coupling a first substrate to a die, wherein the die comprises active circuitry and a first set of contacts, the first set of contacts disposed on a first surface of the die and electrically connected to the active circuitry; and the first substrate comprises a second set of contacts and a third set of contacts on a first side of the first substrate; a fourth set of contacts on a second side of the first substrate; and conductors electrically connected between various contacts of the second set of contacts, the third set of contacts, and the fourth set of contacts, wherein coupling the first substrate to the die comprises electrically coupling the second set of contacts to the first set of contacts of the die. The method also includes disposing a mold compound on the first side of the first substrate, the mold compound at least partially encapsulating the die and a set of through mold conductors, the set of through mold conductors coupled to the third set of contacts and extending through the mold compound; and removing a portion of a surface of the set of through mold conductors to expose a connectivity pad portion of each of the set of through mold conductors.

Example 25 includes the method of Example 24, further comprising removing a portion of the mold compound such that an upper surface of the mold compound is coplanar with the pad portions of the set of through mold conductors.

Example 26 includes the method of Example 24 or Example 25, further comprising removing a portion of the die such that an upper surface of the die is coplanar with the pad portions of the set of through mold conductors.

Example 27 includes the method of any of Examples 24 to 26 and further includes removing a portion of the mold compound and a portion of the die such that an upper surface of the mold compound, an upper surface of the die, and the pad portions of the set of through mold conductors are coplanar.

Example 28 includes the method of any of Examples 24 to 27 and further includes coupling a set of solder balls to the fourth set of contacts to form a ball grid array.

Example 29 includes the method of any of Examples 24 to 28, wherein at least one of the through mold conductors comprises a ball with a copper core at least partially covered with another conductive material.

Example 30 includes the method of Example 29, wherein the conductive material comprises a solder alloy.

Example 31 includes the method of Example 30 and further includes prior to disposing the mold compound on the first side of the first substrate, placing the set of through mold conductors and reflowing the solder alloy to electrically connect the set of through mold conductors to the third set of contacts.

Example 32 includes the method of any of Examples 24 to 31, wherein at least one of the through mold conductors comprises a ball formed from a solder alloy.

Example 33 includes the method of any of Examples 24 to 32, wherein at least one of the through mold conductors comprises a copper post.

Example 34 includes the method of any of Examples 24 to 33 and further includes coupling a memory package to the pad portions of the set of through mold conductors, the memory package comprising a second substrate including a fifth set of contacts to electrically connect a first side of the second substrate to a second side of the second substrate.

Example 35 includes the method of Example 34, wherein coupling the memory package comprises coupling the memory package to the pad portions of the set of through mold conductors such that the pad portions of the set of through mold conductors are electrically coupled to the fifth set of contacts.

Example 36 includes the method of Example 34 or Example 35, wherein the memory package further comprises memory circuitry and a sixth set of contacts disposed on the first side of the second substrate and electrically connected to the memory circuitry.

Example 37 includes the method of Example 36, wherein the memory circuitry comprises dynamic random access memory circuitry.

Example 38 includes the method of any of Examples 34 to 37 and further includes applying a thermal conductive layer to a portion of an upper surface of the die.

Example 39 includes the method of Example 38, wherein applying the thermal conductive layer comprises applying the thermal conductive layer prior to coupling the memory package to the pad portions of the set of through mold conductors.

Example 40 includes the method of Example 38, wherein applying the thermal conductive layer comprises applying the thermal conductive layer after coupling the memory package to the pad portions of the set of through mold conductors.

Example 41 includes the method of any of Examples 24 to 40, wherein the pad portion comprises a copper portion ringed by a solder portion.

According to Example 42, a method of fabricating a device includes coupling a package to a set of through mold conductors of an integrated device comprising a die, a first substrate, a mold compound disposed on a first side of the first substrate and at least partially encapsulating the die, and a set of through mold conductors. In Example 42, the die includes active circuitry and a first set of contacts, the first set of contacts disposed on a first surface of the die and electrically connected to the active circuitry; the first substrate includes a second set of contacts and a third set of contacts on the first side of the first substrate; a fourth set of contacts on a second side of the first substrate; and conductors electrically connected between various contacts of the second set of contacts, the third set of contacts, and the fourth set of contacts, second set of contacts electrically coupled to the first set of contacts of the die; the set of through mold conductors are coupled to the third set of contacts and extend through the mold compound; an upper surface of the mold compound, an upper surface of the die, and an upper surface of each of the set of through mold conductors are coplanar; and the package includes a second substrate including a fifth set of contacts to electrically connect a first side of the second substrate to a second side of the second substrate.

Example 43 includes the method of Example 42, wherein at least one of the through mold conductors comprises a ball with a copper core at least partially covered with another conductive material.

Example 44 includes the method of Example 43, wherein the conductive material comprises a solder alloy.

Example 45 includes the method of any of Examples 42 to 44, wherein at least one of the through mold conductors comprises a ball formed from a solder alloy.

Example 46 includes the method of any of Examples 42 to 45, wherein at least one of the through mold conductors comprises a copper post.

Example 47 includes the method of any of Examples 42 to 46, wherein coupling the package to the set of through mold conductors of an integrated device comprises coupling the package to a pad portion of the set of through mold conductors such that the pad portions of the set of through mold conductors are electrically coupled to the fifth set of contacts.

Example 48 includes the method of any of Examples 42 to 47, wherein the package is a memory package comprising memory circuitry and a sixth set of contacts disposed on the first side of the second substrate and electrically connected to the memory circuitry.

Example 49 includes the method of Example 48, wherein the memory circuitry comprises dynamic random access memory ("DRAM") circuitry.

Example 50 includes the method of any of Examples 42 to 49 and further includes applying a thermal conductive layer to a portion of an upper surface of the die.

Example 51 includes the method of Example 50, wherein applying the thermal conductive layer comprises applying the thermal conductive layer prior to coupling the memory package to a pad portion of the set of through mold conductors.

Example 52 includes the method of Example 51 or Example 52, wherein applying the thermal conductive layer comprises applying the thermal conductive layer after coupling the memory package to a pad portion of the set of through mold conductors.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. An integrated device comprising:
- a die comprising active circuitry and a first set of contacts, the first set of contacts disposed on a first surface of the die and electrically connected to the active circuitry;
- a first substrate including:
  - a second set of contacts and a third set of contacts on a first side of the first substrate;
  - a fourth set of contacts on a second side of the first substrate; and
  - conductors electrically connected between various contacts of the second set of contacts, the third set of contacts, and the fourth set of contacts, wherein the second set of contacts is electrically connected to the first set of contacts of the die;
- a mold compound disposed on the first side of the first substrate and at least partially encapsulating the die;
- a set of through mold conductors coupled to the third set of contacts and extending through the mold compound, wherein at least one through mold conductor of the set of through mold conductors comprises a copper core, wherein an upper portion of the copper core is at least partially covered with another conductive material, wherein a lower portion of the copper core is completely covered with the conductive material, and wherein an upper surface of the mold compound, an upper surface of the die, and an upper surface of each of the set of through mold conductors are coplanar; and
- an air gap between the die and a second substrate, the air gap defined at least in part by the set of through mold conductors coupled to the second substrate.

2. The integrated device of claim 1, further comprising a ball grid array (BGA), wherein the BGA includes or is directly connected to the fourth set of contacts.

3. The integrated device of claim 1, wherein the copper core is a ball and the other conductive material comprises a solder alloy.

4. The integrated device of claim 1, further comprising a memory package coupled to the set of through mold conductors, the memory package comprising the second substrate including a fifth set of contacts to electrically connect a first side of the second substrate to a second side of the second substrate.

5. The integrated device of claim 4, wherein the second side of the second substrate is coupled to the set of through mold conductors such that the upper surface of the through mold conductor directly contacts an interconnect solder ball, and the interconnect solder ball directly contacts a contact of the fifth set of contacts.

6. The integrated device of claim 4, wherein no redistribution layer is disposed between the upper surface of each of the set of through mold conductors and the second side of the second substrate.

7. The integrated device of claim 4, wherein the memory package further comprises memory circuitry and a sixth set of contacts disposed on the first side of the second substrate and electrically connected to the memory circuitry.

8. The integrated device of claim 7, wherein the memory circuitry comprises dynamic random access memory circuitry.

9. The integrated device of claim 1, wherein the upper surface of the through mold conductor comprises a copper portion ringed by a solder portion.

10. A device comprising:
- an integrated device comprising:
  - a die comprising active circuitry and a first set of contacts, the first set of contacts disposed on a first surface of the die and electrically connected to the active circuitry;
  - a first substrate including:
    - a second set of contacts and a third set of contacts on a first side of the first substrate;
    - a fourth set of contacts on a second side of the first substrate; and
    - conductors electrically connected between various contacts of the second set of contacts, the third set of contacts, and the fourth set of contacts, wherein the second set of contacts is electrically connected to the first set of contacts of the die; and
  - a mold compound disposed on the first side of the first substrate and at least partially encapsulating the die; and
  - a set of through mold conductors coupled to the third set of contacts and extending through the mold compound, wherein at least one through mold conductor of the set of through mold conductors comprises a copper core, wherein an upper portion of the copper core is at least partially covered with another conductive material, wherein a lower portion of the copper core is completely covered with the conductive material, and wherein an upper surface of the mold compound, an upper surface of the die, and an upper surface of each of the set of through mold conductors are coplanar; and
- a package coupled to the set of through mold conductors, the package comprising a second substrate including a fifth set of contacts to electrically connect a first side of the second substrate to a second side of the second substrate; and
- an air gap defined between the die and the second substrate.

11. The device of claim 10, wherein the second side of the second substrate is coupled to the set of through mold conductors such that the upper surface of the through mold conductor directly contacts an interconnect solder ball, and the interconnect solder ball directly contacts a contact of the fifth set of contacts.

12. The device of claim 10, wherein no redistribution layer is disposed between the upper surface of each of the set of through mold conductors and the second side of the second substrate.

13. The device of claim 10, wherein the package is a memory package comprising comprises memory circuitry and a sixth set of contacts disposed on the first side of the second substrate and electrically connected to the memory circuitry.

14. The device of claim 13, wherein the memory circuitry comprises dynamic random access memory ("DRAM") circuitry.

15. The device of claim 10, wherein the device is integrated in a smartphone, a tablet computer, a fixed location terminal device, an automobile, a wearable electronic device, a laptop computer, or some combination thereof.

16. The device of claim 10, wherein the copper core is a ball and the other conductive material comprises a solder alloy.

17. The device of claim 10, wherein the upper surface of the through mold conductor comprises a copper portion ringed by a solder portion.

18. A method of fabricating an integrated device, the method comprising:

coupling a first substrate to a die, wherein:

the die comprises active circuitry and a first set of contacts, the first set of contacts disposed on a first surface of the die and electrically connected to the active circuitry; and the first substrate comprises:

a second set of contacts and a third set of contacts on a first side of the first substrate;

a fourth set of contacts on a second side of the first substrate; and conductors electrically connected between various contacts of the second set of contacts, the third set of contacts, and the fourth set of contacts, wherein coupling the first substrate to the die comprises electrically coupling the second set of contacts to the first set of contacts of the die;

disposing a mold compound on the first side of the first substrate, the mold compound at least partially encapsulating the die and a set of through mold conductors, the set of through mold conductors coupled to the third set of contacts and extending through the mold compound; and removing a portion of a surface of the set of through mold conductors to expose a connectivity pad portion of each of the set of through mold conductors; and removing a portion of the mold compound and a portion of the die such that an upper surface of the mold compound, an upper surface of the die, and the pad portions of the set of through mold conductors are coplanar.

19. The method of claim 18, further comprising removing a portion of the mold compound such that an upper surface of the mold compound is coplanar with the pad portions of the set of through mold conductors.

20. The method of claim 18, further comprising coupling a set of solder balls to the fourth set of contacts to form a ball grid array ("BGA").

21. The method of claim 18, wherein at least one of the through mold conductors comprises a ball with a copper core at least partially covered with a solder alloy, the method further comprising prior to disposing the mold compound on the first side of the first substrate, placing the set of through mold conductors and reflowing the solder alloy to electrically connect the set of through mold conductors to the third set of contacts.

22. The method of claim 18, further comprising coupling a memory package to the pad portions of the set of through mold conductors, the memory package comprising a second substrate including a fifth set of contacts to electrically connect a first side of the second substrate to a second side of the second substrate.

23. The method of claim 22, wherein coupling the memory package comprises coupling the memory package to the pad portions of the set of through mold conductors such that the pad portions of the set of through mold conductors are electrically coupled to the fifth set of contacts.

24. The method of claim 23, wherein the memory package further comprises memory circuitry and a sixth set of contacts disposed on the first side of the second substrate and electrically connected to the memory circuitry.

25. The method of claim 22, further comprising applying a thermal conductive layer to a portion of the upper surface of the die prior to or after coupling the memory package to the pad portions of the set of through mold conductors.

26. The method of claim 22, wherein the pad portion comprises a copper portion ringed by a solder portion.

27. A method of fabricating a device, the method comprising coupling a package to a set of through mold conductors of an integrated device comprising a die, a first substrate, a mold compound disposed on a first side of the first substrate and at least partially encapsulating the die, and a set of through mold conductors, wherein:

the die comprises active circuitry and a first set of contacts, the first set of contacts disposed on a first surface of the die and electrically connected to the active circuitry;

the first substrate comprises:

a second set of contacts and a third set of contacts on the first side of the first substrate;

a fourth set of contacts on a second side of the first substrate; and conductors electrically connected between various contacts of the second set of contacts, the third set of contacts, and the fourth set of contacts, second set of contacts electrically coupled to the first set of contacts of the die;

at least one through mold conductor of the set of through mold conductors comprises a copper core;

an upper portion of the copper core is at least partially covered with another conductive material;

a lower portion of the copper core is completely covered with the conductive material;

the set of through mold conductors are coupled to the third set of contacts and extend through the mold compound;

an upper surface of the mold compound, an upper surface of the die, and an upper surface of each of the set of through mold conductors are coplanar;

the package comprises a second substrate including a fifth set of contacts to electrically connect a first side of the second substrate to a second side of the second substrate; and an air gap is defined between the die and the second substrate.

28. The method of claim 27, wherein coupling the package to the set of through mold conductors of the integrated device comprises coupling the package to a pad portions of the set of through mold conductors such that the pad portions of the set of through mold conductors are electrically coupled to the fifth set of contacts.

29. The integrated device of claim 1, further comprising a thermal conductive layer applied to a portion of the upper surface of the die to facilitate heat dissipation within the air gap.

30. The device of claim 10, further comprising a thermal conductive layer applied to a portion of the upper surface of the die to facilitate heat dissipation within the air gap.

* * * * *